United States Patent
Jang et al.

(10) Patent No.: US 12,249,386 B2
(45) Date of Patent: Mar. 11, 2025

(54) MEMORY, MEMORY SYSTEM AND OPERATION METHOD OF MEMORY SYSTEM

(71) Applicant: SK hynix Inc., Gyeonggi-do (KR)

(72) Inventors: Munseon Jang, San Jose, CA (US); Hoiju Chung, San Jose, CA (US); Jang Ryul Kim, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/482,016

(22) Filed: Oct. 6, 2023

(65) Prior Publication Data

US 2024/0029810 A1     Jan. 25, 2024

Related U.S. Application Data

(62) Division of application No. 17/532,826, filed on Nov. 22, 2021, now Pat. No. 11,817,169.

(60) Provisional application No. 63/235,511, filed on Aug. 20, 2021.

(51) Int. Cl.
| | |
|---|---|
| *G11C 29/42* | (2006.01) |
| *G11C 7/10* | (2006.01) |
| *G11C 29/00* | (2006.01) |
| *G11C 29/12* | (2006.01) |

(52) U.S. Cl.
CPC ............ *G11C 29/42* (2013.01); *G11C 7/1039* (2013.01); *G11C 29/1201* (2013.01); *G11C 29/702* (2013.01)

(58) Field of Classification Search
CPC ... G11C 29/42; G11C 7/1039; G11C 29/1201; G11C 29/702
See application file for complete search history.

(56) References Cited

U.S. PATENT DOCUMENTS

| | | | |
|---|---|---|---|
| 2017/0206133 A1* | 7/2017 | Haneda | ............... G06F 11/1004 |
| 2019/0146869 A1* | 5/2019 | Howe | ................ G06F 11/1068 |
| | | | 714/764 |

* cited by examiner

*Primary Examiner* — Han Yang
(74) *Attorney, Agent, or Firm* — IP & T GROUP LLP

(57) ABSTRACT

A memory system includes a memory; and a memory controller which includes a spare buffer suitable for storing an error location in the memory and data at the location, and commands the memory to perform a spare read operation when a read operation needs to be performed in a region of the memory including the error location.

9 Claims, 4 Drawing Sheets

MEMORY, MEMORY SYSTEM AND OPERATION METHOD OF MEMORY SYSTEM

CROSS-REFERENCE TO RELATED APPLICATIONS

This application is a division of U.S. patent application Ser. No. 17/532,826 filed on Nov. 22, 2021, which claims priority to U.S. Provisional Patent Application No. 63/235,511, filed on Aug. 20, 2021, which is incorporated herein by reference in its entirety.

BACKGROUND

1. Field

Various embodiments of the present invention relate to a memory and a memory system.

2. Description of the Related Art

In the early stage of a semiconductor memory device industry, there were many originally good dies on wafers, which means that memory chips were produced with no defective memory cells through a semiconductor fabrication process. However, as the capacity of memory devices increases, it becomes difficult to fabricate a memory device that does not have any defective memory cell, and nowadays, it may be said that there is substantially no chance that a memory device is fabricated without any defective memory cells. To solve this issue, a repair method of including redundant memory cells in a memory device and replacing defective memory cells with the redundant memory cells is being used.

Another method to solve the issue above is an error correction circuit (ECC circuit) for correcting errors in a memory system which is used to correct errors occurring in memory cells and errors occurring when data are transferred during a read operation and a write operation of the memory system.

SUMMARY

Embodiments of the present invention are directed to a technology for increasing error correction efficiency.

In accordance with an embodiment of the present invention, a memory system includes: a memory; and a memory controller which includes a spare buffer suitable for storing an error location in the memory and data at the location, and commands the memory to perform a spare read operation when a read operation needs to be performed in a region of the memory including the error location.

In accordance with another embodiment of the present invention, a memory includes: a memory core; a data replacing circuit suitable for generating new read data by replacing a portion of data read from the memory core with a predetermined pattern of data during a spare read operation; an error correction circuit suitable for detecting an error in the new read data based on an error correction code read from the memory core during the spare read operation and, when an error is detected, correcting the error; and a data transferring circuit suitable for transferring output data of the error correction circuit to the memory controller during the spare read operation.

In accordance with yet another embodiment of the present invention, a method for operating a memory system includes: confirming, by a memory controller, that an error exists in a region of a memory where a read operation needs to be performed; commanding, by the memory controller, the memory to perform a spare read operation in response to the confirming of the error; reading, by the memory, data and a read error correction code from a memory core; generating, by the memory, new read data by replacing a portion of the read data with a predetermined pattern of data; performing, by the memory, an error correction operation of correcting an error of the new read data based on the read error correction code; and transferring, by the memory to the memory controller, the new read data on which the error correction operation is performed as error-corrected read data.

In accordance with still yet another embodiment of the present invention, a method for operating

DETAILED DESCRIPTION

Figure 1:
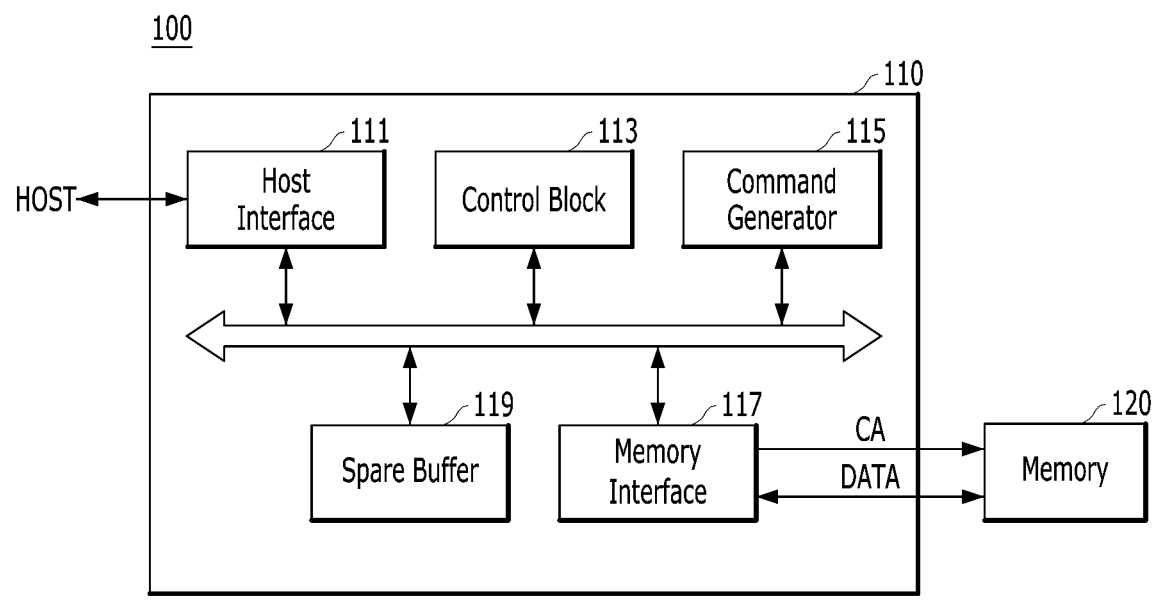
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory system 100 in accordance with an embodiment of the present invention.

Referring to FIG. 1, the memory system 100 may include a memory controller 110 and a memory 120.

The memory controller 110 may control the operation of the memory 120 according to a request of a host HOST. The host HOST may include a Central Processing Unit (CPU), a Graphic Processing Unit (GPU), an Application Processor (AP), and the like. The memory controller 110 may include a host interface 111, a control block 113, a command generator 115, a memory interface 117, and a spare buffer 119. The memory controller 110 may be included in a CPU, GPU, AP, etc. In this case, the host HOST may mean the constituent elements other than the memory controller 110 in these structures. For example, when the memory controller 110 is included in a CPU, the host HOST in the figure may represent the other constituent elements except for the memory controller 110 in the CPU.

The host interface 111 may be an interface for communication between the host HOST and the memory controller 110.

The control block 113 may control the overall operations of the memory controller 110 and schedule the operations to be commanded to the memory 120. The control block 113 may change the order of the requests received from the host HOST and the order of the operations to be commanded to the memory 120 in order to improve the performance of the memory 120. For example, even though the host HOST requests the memory 120 for a read operation first and then requests for a write operation, the control block 113 may adjust the operation order such that the write operation is performed before the read operation.

The command generator 115 may generate a command to be applied to the memory 120 according to the order of the operations determined by the control block 113.

The memory interface 117 may be an interface between the memory controller 110 and the memory 120. A command and an address CA may be transferred from the memory controller 110 to the memory 120 through the memory interface 117. Data DATA may be transferred and received between the memory controller 110 and the memory 120. The memory interface 117 may also be referred to as a PHY interface.

The spare buffer 119 may store a location where an error (i.e., a defect) exists in the memory 120 and data regarding the location.

Figure 2:
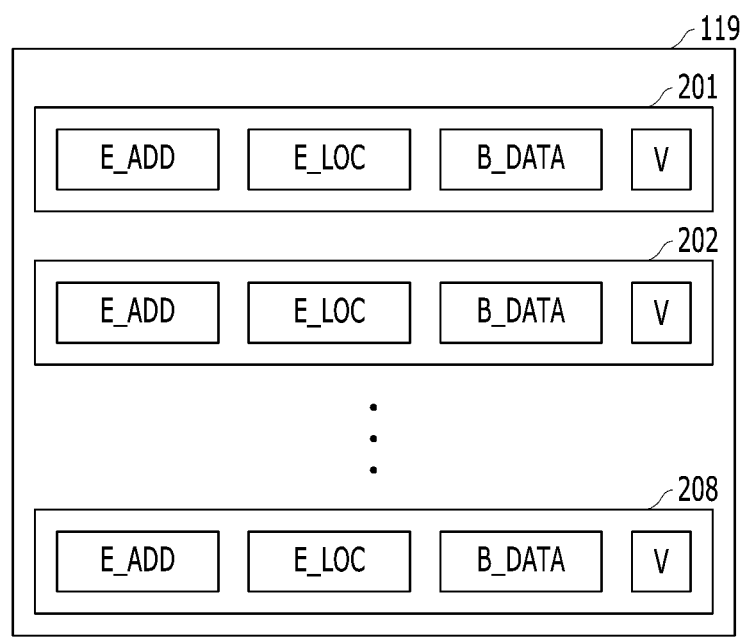
FIG. 2 is a block diagram illustrating information stored in a spare buffer in accordance with an embodiment of the present invention.

FIG. 2 shows information stored in a spare buffer in accordance with an embodiment of the present invention, e.g., the spare buffer 119 in FIG. 1. Referring to FIG. 2, the spare buffer 119 may include a plurality of buffer sets 201 to 208. Each of the buffer sets 201 to 208 may store an error address E_ADD, an error location E_LOC, buffer data B_DATA, and a valid bit V.

The error address E_ADD may be an address of a region of the memory 120 including an error. The error address E_ADD may include a row address and a column address.

The error location E_LOC may represent a location where an error exists in the region designated by the error address E_ADD. When 128 memory cells, that is, 128-bit data (which is 8 symbols, 1 symbol is 16 bits), are selected in the memory 120 based on the error address E_ADD, the error location E_LOC may be information that represents a symbol among 8 symbols of the 128-bit data selected based on the error address E_ADD, in which an error is included. In other words, when the error address E_ADD is information for selecting 128 memory cells in the memory 120, the error location E_LOC may be information representing 16 memory cells among the 128 memory cells in which errors exist.

The buffer data B_DATA may be stored data instead of the 16 memory cells (defective memory cells) designated by the error address E_ADD and the error location E_LOC.

A valid bit V may be information representing the validity of a buffer set. When the valid bit V has a value of 0, the corresponding buffer set may be not used. When the valid bit V has a value of 1, the corresponding buffer set may be used.

The spare buffer 119 may store information representing which memory cells among the memory cells of the memory 120 have an error. The information may be collected during a test process of the memory 120 or it may be collected by an error check and scrub (ECS) operation.

It is illustrated herein that the spare buffer 119 includes 8 buffer sets 201 to 208, 128 memory cells are selected based on the error address E_ADD, 16 memory cells among the 128 memory cells are selected based on the error location E_LOC, and the buffer data B_DATA has a size of 16 bits. However, this is only an example, and it should be apparent to those skilled in the art that these numbers may be changed.

Referring back to FIG. 1, the control block 113 of the memory controller 110 may refer to the spare buffer 119 during a read operation and/or a write operation of the memory 120. Further, the control block 113 may determine whether to command the memory 120 to perform a normal read operation and/or a normal write operation, or to command the memory 120 to perform a spare read operation and/or a spare write operation. The control block 113 may command the memory 120 to perform a spare read operation when the address of a region where a read operation needs to be performed matches with the error address E_ADD stored in the spare buffer 119. Otherwise, it may command the memory 120 to perform a normal read operation. Also, the control block 113 may command the memory 120 to perform a spare write operation when the address of a region where a write operation needs to be performed matches with the error address E_ADD stored in the spare buffer 119. Otherwise, it may command the memory 120 to perform a normal write operation. The spare read operation and the spare write operation will be described later with reference to the drawings.

The memory 120 may perform an operation commanded by the memory controller 110. The memory 120 will be described in detail with reference to FIG. 3.

Figure 3:
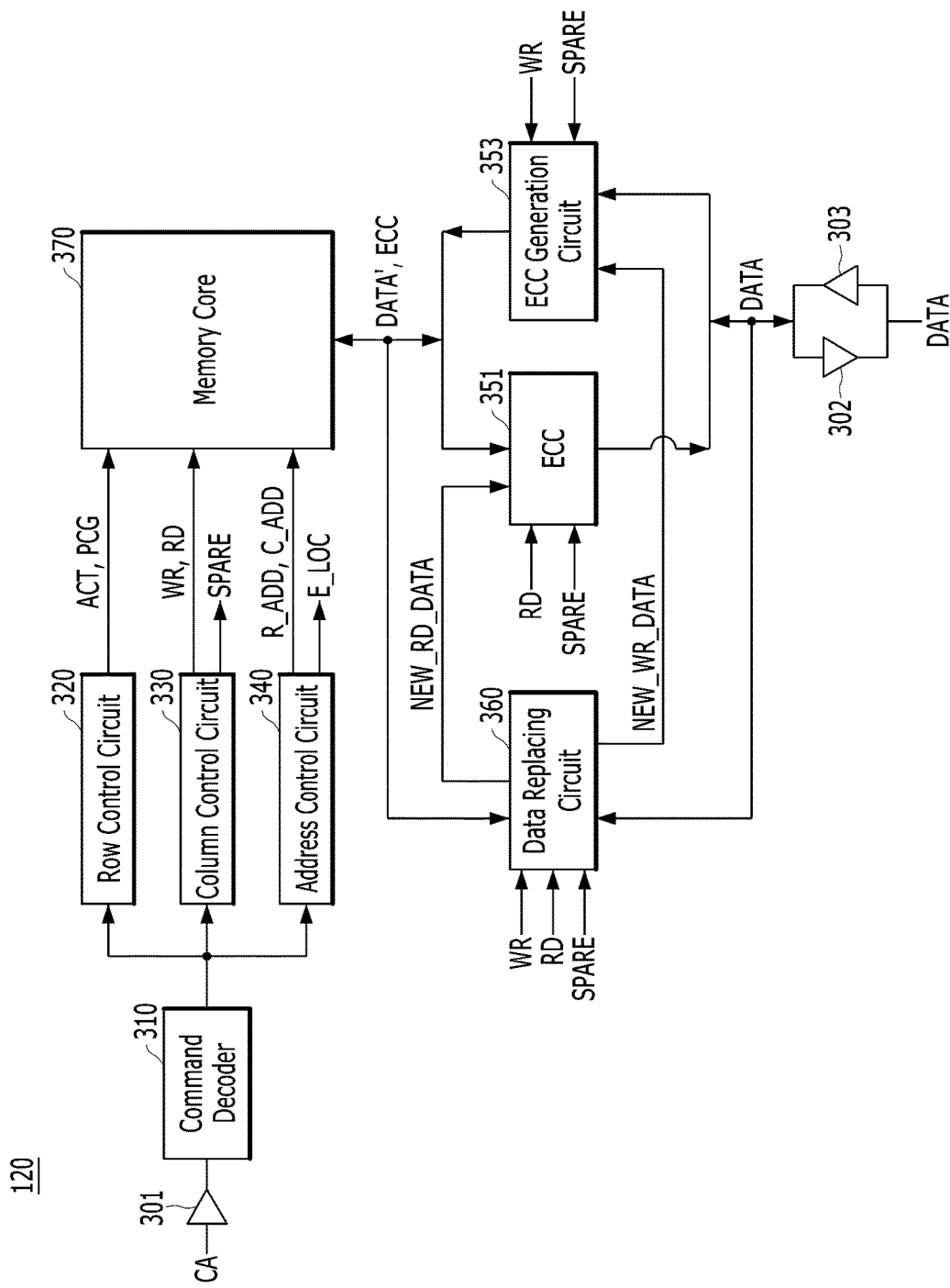
FIG. 3 is a block diagram illustrating a memory in accordance with an embodiment of the present invention.

FIG. 3 is a block diagram illustrating a memory in accordance with an embodiment of the present invention, e.g., the memory 120 shown in FIG. 1.

Referring to FIG. 3, the memory 120 may include a command address receiving circuit 301, a data transferring circuit 302, a data receiving circuit 303, a command decoder 310, a row control circuit 320, and a column control circuit 330, an address control circuit 340, an error correction circuit (ECC) 351, an error correction code (ECC) generation circuit 353, a data replacing circuit 360, and a memory core 370.

The command address receiving circuit 301 may receive a command and an address CA. Depending on the type of the memory 120, a command and an address may be input to the same input terminals, or a command and an address may be input to separate input terminals. It is illustrated herein that a command and an address are input to the same input terminals. The command and the address CA may be multiple bits.

The data transferring circuit 302 may be used to transfer data DATA to the memory controller 110. The data receiving circuit 303 may be used to receive data DATA from the memory controller 110.

The command decoder 310 may decode the command and the address CA to find out the type of the operation commanded by the memory controller 110 to the memory 120.

When it turns out as a result of the decoding of the command decoder 310 that a row-based operation such as an active operation or a precharge operation is commanded, the row control circuit 320 may control these operations. An active signal ACT may be a signal commanding an active operation, and a precharge signal PCG may be a signal commanding a precharge operation.

When it turns out as a result of the decoding of the command decoder 310 that a column-based operation such as a write operation and a read operation is commanded, the column control circuit 330 may control these operations. A write signal WR may be a signal commanding a write operation, and a read signal RD may be a signal commanding a read operation. Further, when it turns out as a result of the decoding of the command decoder 310 that a spare read operation and a spare write operation are commanded, the column control circuit 330 may activate a spare signal SPARE representing that the read or write operation that is being currently performed is not a normal operation but a spare operation.

The address control circuit 340 may determine the address received from the command decoder 310 as a row address R_ADD or a column address C_ADD and transfer it to the memory core 370. When it turns out as a result of the decoding of the command decoder 310 that an active operation is commanded, the address control circuit 340 may determine the received address as a row address R_ADD. When it turns out as a result of the decoding of the command decoder 310 that a read operation and a write operation are commanded, the address control circuit 340 may determine the received address as a column address C_ADD. Further, the address control circuit 340 may determine the error location E_LOC based on the address received from the command decoder 310. During a spare read operation and a spare write operation, the error location E_LOC may be further transferred from the memory controller 110 to the memory 120 in the form of an address, and the address control circuit 340 may thus detect the transferred address.

The data replacing circuit 360 may replace a portion of the write data DATA received through the data receiving circuit 303 with a predetermined pattern of data during a spare write operation in which the write signal WR and the spare signal SPARE are activated to generate new write data NEW_WR_DATA. Which part of the write data DATA should be replaced with the data of the predetermined pattern may be determined based on the error location E_LOC. The data of the predetermined pattern may be data of all bits which have a level of '0'.

Also, the data replacing circuit 360 may replace a portion of the data DATA' read from the memory core 370 with a predetermined pattern of data during a spare read operation in which a read signal RD and the spare signal SPARE are activated to generate new read data NEW_RD_DATA. Which part of the data DATA' should be replaced with the data of the predetermined pattern may be determined based on the error location E_LOC. The data of the predetermined pattern may all have a level of '0'.

The data replacing circuit 360 may be deactivated during a normal write operation and a normal read operation.

The error correction circuit 351 may correct an error in the data DATA' read from the memory core 370 based on the error correction code ECC read from the memory core 370 during a normal read operation in which the read signal RD is activated and the spare signal SPARE is deactivated. Here, correcting an error may mean sensing (detecting) the presence of an error in the data DATA' and correcting the error detected in the data DATA'.

The error correction circuit 351 may correct an error in the new read data NEW_RD_DATA generated by the data replacing circuit 360 based on the error correction code ECC that is read from the memory core 370 during a spare read operation in which the read signal RD is activated and the spare signal SPARE is activated. Herein, correcting an error may mean sensing (detecting) the presence of an error in the new read data NEW_RD_DATA and correcting the error detected in the new read data NEW_RD_DATA.

The error correction code generation circuit 353 may generate an error correction code ECC based on the data DATA received through the data receiving circuit 303 during a normal write operation in which the write signal WR is activated and the spare signal SPARE is deactivated. Since an error correction code ECC is generated based on the data DATA but an error in the data DATA is not corrected during a write operation, the data DATA input to the error correction code generation circuit 353 and the data DATA output from the error correction code generation circuit 353 may be the same.

The error correction code generation circuit 353 may generate an error correction code ECC based on the new write data NEW_WR_DATA generated by the data replacing circuit 360 during a spare write operation in which the write signal WR is activated and the spare signal SPARE is activated. Since an error correction code ECC is generated based on the new write data NEW_WR_DATA but an error of the new write data NEW_WR_DATA is not corrected during a spare write operation, the data NEW_WR_DATA input to the error correction code generation circuit 353 and the data DATA output from the error correction code generation circuit 353 may be the same.

The memory core 370 may perform an operation commanded by internal command signals ACT, PCG, WR, and RD. The memory core 370 may include a cell array including memory cells that are arranged in a plurality of rows and a plurality of columns, a row decoder for activating/deactivating a row of the cell array, a column decoder for inputting/outputting data to/from the cell array, and constituent elements for active, precharge, read, and write operations, such as an input/output circuit and the like. When the active signal ACT is activated, a row selected based on the row address R_ADD among the rows of the memory core 370 may be activated. When the precharge signal PCG is activated, the activated row may be deactivated. When the write signal WR is activated, the data DATA' and the error correction code ECC may be written into the columns selected based on the column address C_ADD among the columns of the memory core 370. When the read signal RD is activated, the data DATA' and the error correction code ECC may be read from the columns selected based on the column address C_ADD among the columns of the memory core 370.

Figure 4:
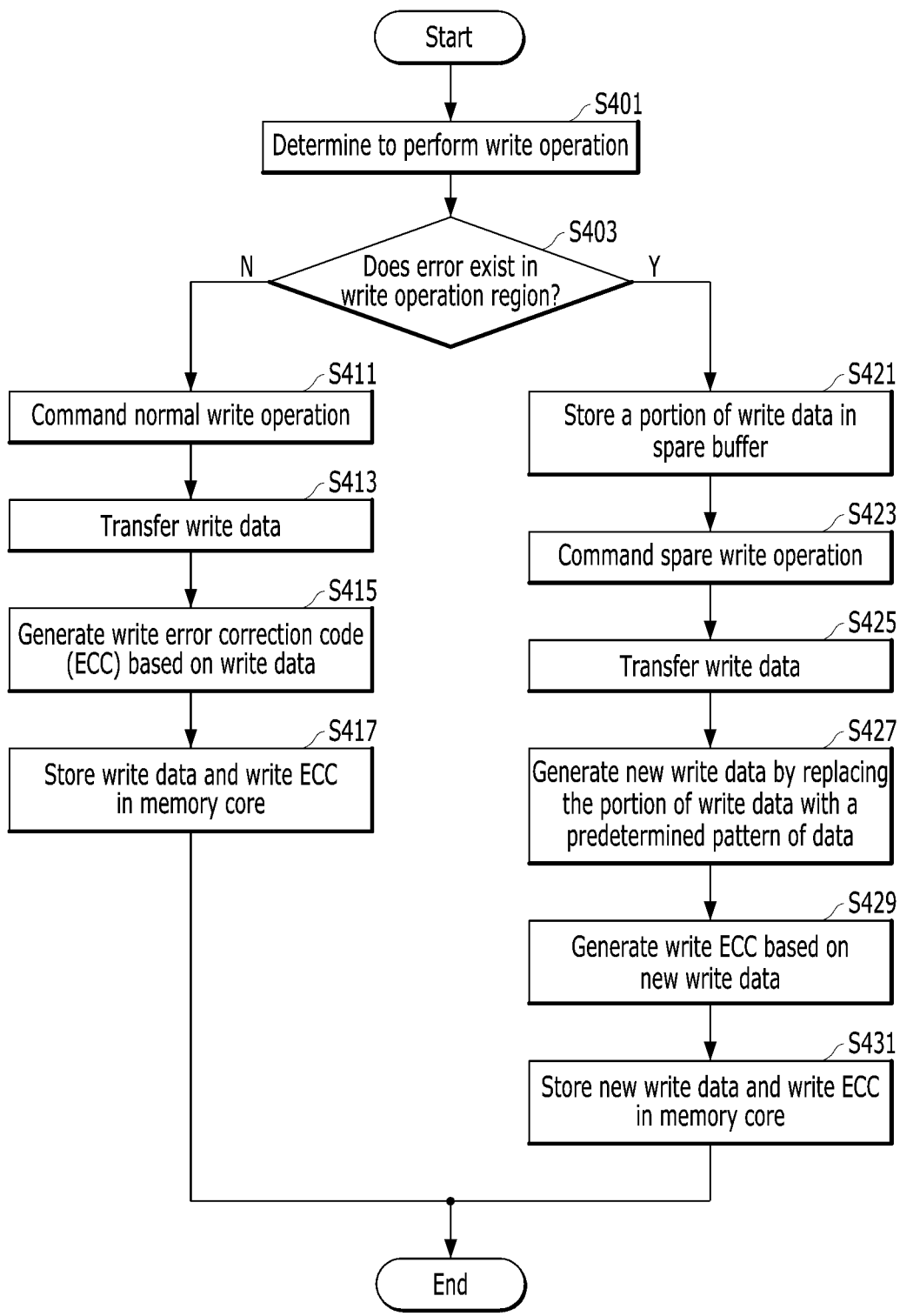
FIG. 4 is a flowchart describing a write operation of a memory system in accordance with an embodiment of the present invention.

FIG. 4 is a flowchart describing a write operation of a memory system (e.g., the memory system 100 shown in FIG. 1) in accordance with an embodiment of the present invention.

Referring to FIG. 4, in operation S401, the memory controller 110 may determine to perform a write operation. The write operation may be determined to be performed as the host HOST transfers a write operation request to the memory controller 110 through the host interface 111.

In operation S403, the control block 113 of the memory controller 110 may check whether there is an error in a region where a write operation needs to be performed. The control block 113 may check whether an address at which a write operation is to be performed is stored in the spare buffer 119 or not and check whether there is an error in a region where a write operation needs to be performed. When the address at which a write operation is to be performed matches the error address E_ADD stored in one among the buffer sets 201 to 208 of the spare buffer 119, it may be determined that an error exists in the region where a write operation needs to be performed. Otherwise, it may be determined that an error does not exist in the region where a write operation needs to be performed.

When it is determined that an error does not exist in the region where a write operation needs to be performed (N in operation S403), a normal write operation, i.e., operations S411 to S417, may be performed.

In operation S411, the memory controller 110 may command the memory 120 to perform a normal write operation. This may be performed as the memory controller 110 applies a command to perform a normal write operation and an address designating the region where a write operation is to be performed in the memory 120. In operation S413, write data DATA may be transferred from the memory controller 110 to the memory 120. The memory 120 may receive the write data DATA through the data receiving circuit 303.

In operation S415, the error correction code generation circuit 353 of the memory 120 may generate a write error correction code ECC based on the write data DATA. In operation S417, write data DATA' and the write error correction code ECC may be stored in the memory core 370. Thereafter, the normal write operation may be terminated.

When it is determined that an error exists in the region where a write operation needs to be performed (Y in the operation S403), a spare write operation, i.e., operations S421 to S431, may be performed.

In operation S421, the memory controller 110 may store a portion of the write data DATA to be transferred to the memory 120 in the spare buffer 119. The portion of the write data DATA may be stored as buffer data B_DATA in a buffer set that stores an error address E_ADD that matches the write address among the buffer sets 201 to 208 of the spare buffer 119. Herein, the portion of the write data DATA may be data at a location corresponding to the error location E_LOC.

In operation S423, the memory controller 110 may command the memory 120 to perform a spare write operation. This may be performed as the memory controller 110 transfers a command to perform a spare write operation, an address designating a region where a write operation is to be performed, and an error location E_LOC to the memory 120. In operation S425, write data DATA may be transferred from the memory controller 110 to the memory 120. The memory 120 may receive the write data DATA through the data receiving circuit 303.

In operation S427, the data replacing circuit 360 of the memory 120 may generate new write data NEW_WR_DATA by replacing a portion of the write data DATA with a predetermined pattern of data such as '000 . . . 0'. The portion to be replaced in the write data DATA may be determined based on the error location E_LOC.

In operation S429, the error correction code generation circuit 353 of the memory 120 may generate a write error correction code ECC based on the new write data NEW_WR_DATA. In operation S431, the new write data DATA' and the write error correction code ECC may be stored in the memory core 370. Thereafter, the spare write operation may be terminated.

Referring to FIG. 4, during a spare write operation, data at an error location in the memory core 370 may be stored in the spare buffer 119 instead. Also, after the data at the error location is replaced with the predetermined pattern of data in the memory 120, an operation of generating an error correction code ECC and storing the generated error correction code ECC in the memory core 370 may be performed.

Figure 5:
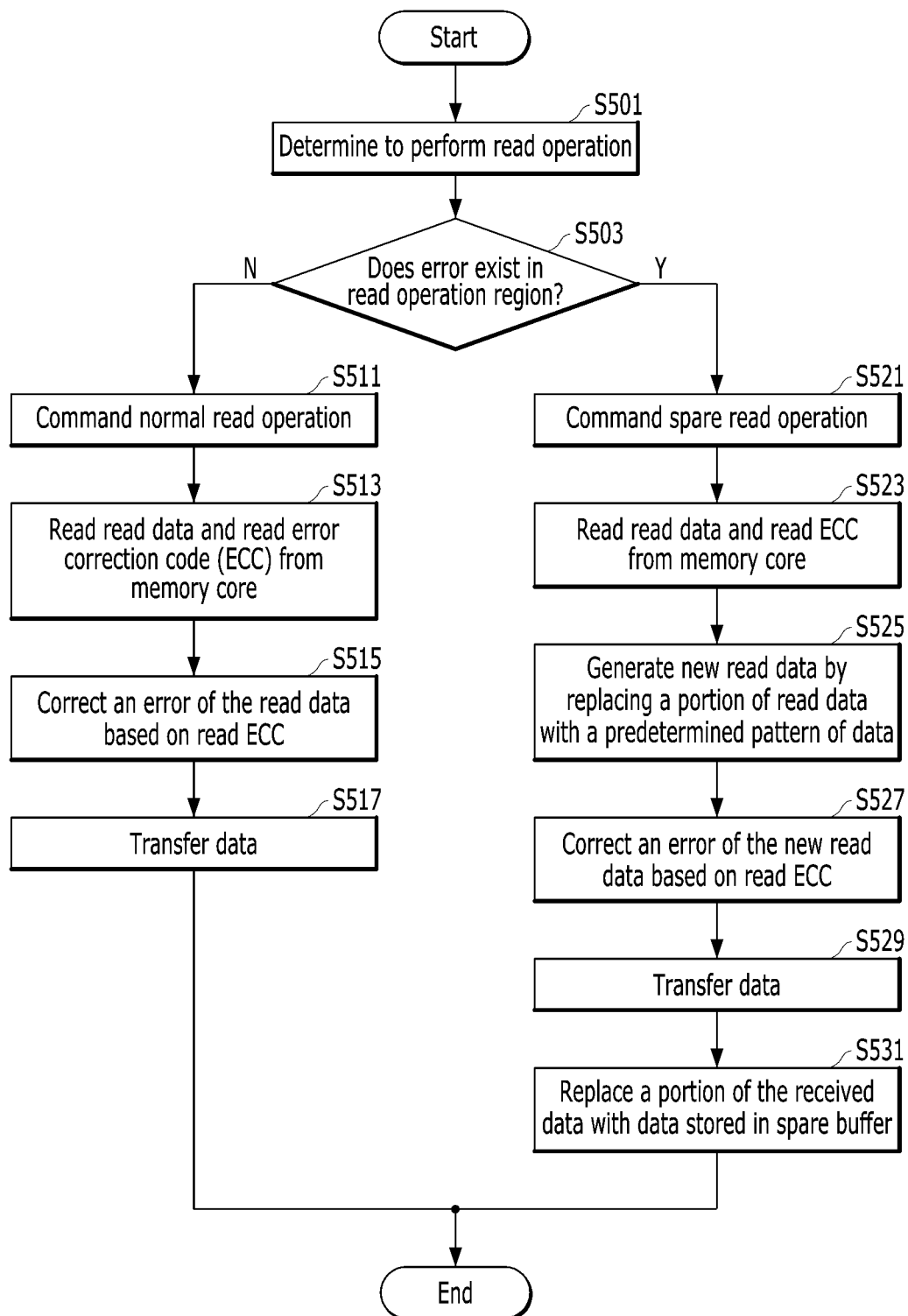
FIG. 5 is a flowchart describing a read operation of a memory system in accordance with the embodiment of the present invention.

FIG. 5 is a flowchart describing a read operation of a memory system (e.g., the memory system 100 shown in FIG. 1) in accordance with the embodiment of the present invention.

Referring to FIG. 5, in operation S501, the memory controller 110 may determine to perform a read operation. The read operation may be determined to be performed as a request to perform a read operation is transferred from the host HOST to the memory controller 110 through the host interface 111.

In operation S503, the control block 113 of the memory controller 110 may check whether there is an error in a region where a read operation is to be performed. The control block 113 may check whether an address at which a read operation is to be performed is stored in the spare buffer 119 or not and determine whether there is an error or not in the region where a read operation is to be performed. When the address at which a read operation is to be performed matches an error address E_ADD stored in one among the buffer sets 201 to 208 of the spare buffer 119, it may be determined that an error exists in the region where a read operation is to be performed. Otherwise, it may be determined that an error does not exist in the region where a read operation is to be performed.

When it is determined that an error does not exist in the region where a read operation is to be performed (N in operation S503), a normal read operation, i.e., operations S511 to S517, may be performed.

In operation S511, the memory controller 110 may command the memory 120 to perform a normal read operation. This may be performed as the memory controller 110 applies a command to perform a normal read operation and an address designating the region where a read operation is to be performed to the memory 120.

In operation S513, read data DATA' and a read error correction code ECC may be read from the memory core 370 of the memory 120.

In operation S515, the error correction circuit 351 of the memory 120 may correct an error in the read data DATA' based on a read error correction code ECC. Correcting an error may mean sensing (detecting) the presence of an error in the read data DATA' and correcting the error detected in the read data DATA'.

In operation S517, the data DATA on which an error correction operation is performed by the error correction circuit 351 may be transferred to the memory controller 110 through the data transferring circuit 302. Accordingly, the normal read operation may be terminated. The memory controller 110 may provide the data DATA received from the memory 120 to the host HOST.

When it is determined that an error exists in a region where a read operation needs to be performed (Y in operation S503), a spare read operation, i.e., operations S521 to 531, may be performed.

In operation S521, the memory controller 110 may command the memory 120 to perform a spare read operation. This may be performed as the memory controller 110 transfers a command for performing a spare read operation, an address designating the region where a read operation needs to be performed, and an error location E_LOC to the memory 120.

In operation S523, read data DATA' and the read error correction code ECC may be read from the memory core 370 of the memory 120.

In operation S525, the data replacing circuit 360 of the memory 120 may generate new read data NEW_RD_DATA by replacing a portion of the read data DATA' with a predetermined pattern of data such as '000 . . . 0'. The portion to be replaced in the read data DATA' may be determined based on the error location E_LOC.

In operation S527, the error correction circuit 351 of the memory 120 may correct an error in the new read data NEW_RD_DATA based on the read error correction code ECC. Herein, correcting the error may mean sensing (detecting) an error in the new read data NEW_RD_DATA and correcting the error detected in the new read data NEW_RD_DATA.

In operation S529, the data DATA on which an error correction operation is performed by the error correction circuit 351 may be transferred to the memory controller 110 through the data transferring circuit 302. In operation S531, the memory controller 110 may replace a portion of the data DATA received from the memory 120 with the buffer data B_DATA stored in the spare buffer 119. Also, the data obtained by replacing the portion of the data DATA with the buffer data B_DATA may be provided to the host HOST.

Referring to FIG. 5, during a spare read operation, after the data read from an error location among the data DATA' read from the memory core 370 is replaced with a predetermined data, an error correction operation may be performed, and the result may be transferred to the memory controller 110. Also, the memory controller 110 may replace a portion of the data transferred from the memory 120 with the buffer data B_DATA and provide it to the host HOST.

In other words, during a spare write operation, the data to be stored in a defective location in the memory core 370 may be stored instead in the spare buffer 119. Further, during a spare read operation, the data read from the defective location in the memory core 370 may be replaced with the data of the spare buffer 119. Accordingly, no error may occur in the processes of performing a write operation and a read operation even though there is the defective position in the memory core 370.

According to the embodiment of the present invention, the error correction efficiency of a memory system may be increased.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory system, comprising:
a memory; and
a memory controller which includes a spare buffer suitable for storing an error location in the memory and data at the location, and commands the memory to perform a spare read operation when an address of a region where a read operation needs to be performed matches with an error address stored in the spare buffer, otherwise, commands the memory to perform a normal read operation,
wherein the error address is an address of the region of the memory including the error location,
wherein the memory includes:
a memory core;
a data replacing circuit suitable for generating new read data by replacing a portion of data read from the memory core with a predetermined pattern of data during the spare read operation;
an error correction circuit suitable for detecting an error in the new read data based on an error correction code read from the memory core during the spare read operation, and correcting the error when an error is detected; and
a data transferring circuit suitable for transferring output data of the error correction circuit to the memory controller during the spare read operation, and wherein when a write operation is required for the region of the memory including the error location,
the memory controller commands the memory to perform a spare write operation and stores a portion of write data in the spare buffer.

2. The memory system of claim 1, wherein the memory further includes:
a data receiving circuit suitable for receiving the write data; and
an error correction code generation circuit,
wherein, during the spare write operation,
the data replacing circuit generates new write data by replacing a portion of the write data received through the data receiving circuit with the predetermined pattern of the data,
the error correction code generation circuit generates an error correction code based on the new write data, and
the memory core stores the new write data and the error correction code.

3. The memory system of claim 2, wherein the memory controller informs the memory of a location of data to be replaced by the data replacing circuit during the spare write operation.

4. A memory, comprising:
a memory core;
a data replacing circuit suitable for generating new read data by replacing a portion of data read from the memory core with a predetermined pattern of data during a spare read operation;
an error correction circuit suitable for detecting an error in the new read data based on an error correction code read from the memory core during the spare read operation and, when an error is detected, correcting the error;
a data transferring circuit suitable for transferring output data of the error correction circuit to a memory controller during the spare read operation;
an address control circuit suitable for determining an error location based on address received from a command decoder;
a data receiving circuit suitable for receiving write data; and
an error correction code generation circuit,
wherein during the spare read operation, the error location is transferred from the memory controller to the memory in a form of the address, and the address control circuit detects transferred address, and
wherein, during the spare write operation,
the data replacing circuit generates new write data by replacing a portion of the write data received through the data receiving circuit with the predetermined pattern of the data,
the error correction code generation circuit generates an error correction code based on the new write data, and
the memory core stores the new write data and the error correction code.

5. The memory of claim 4, wherein the spare write operation is commanded in response to a command for performing the spare write operation, an address, and information representing a location of data to be replaced by the data replacing circuit from a memory controller.

6. A method for operating a memory system, comprising:
confirming, by a memory controller, that an address of a region of a memory where a read operation needs to be performed matches with an error address stored in a spared buffer;

commanding, by the memory controller, the memory to perform a spare read operation in response to the confirming of the address of the region of the memory;

reading, by the memory, data and a read error correction code from a memory core;

generating, by the memory, new read data by replacing a portion of the read data with a predetermined pattern of data;

performing, by the memory, an error correction operation of correcting an error of the new read data based on the read error correction code;

transferring, by the memory to the memory controller, the new read data on which the error correction operation is performed as error-corrected read data;

replacing, by the memory controller, a portion of the error-corrected read data from the memory with the data stored in a spare buffer;

confirming, by the memory controller, that an error exists in a region where a write operation needs to be performed;

storing, by the memory controller, a portion of the write data in the spare buffer;

commanding, by the memory controller, the memory to perform a spare write operation;

transferring, by the memory controller, the write data to the memory;

generating, by the memory, new write data by replacing a portion of the write data with the predetermined pattern of the data;

generating, by the memory, a write error correction code based on the new write data; and storing, by the memory, the new write data and the write error correction code in the memory core.

7. The method of claim 6, wherein the commanding, by the memory controller, of the memory to perform the spare write operation includes:

transferring, to the memory, a command for performing the spare write operation, an address, and information representing a location of data to be replaced by a data replacing circuit.

8. A memory system comprising:

a memory including a plurality of regions; and a memory controller coupled to the memory and including a spare buffer, wherein the memory controller is configured to:

determine whether a write region among the plurality of regions, which is associated with a write operation on write data, is a region including an error location; and when it is determined that the write region is the region including the error location, control the memory to perform a spare write operation by:

storing the write data in the spare buffer;

replacing a portion of the write data with a set pattern of data to generate new write data; and storing the new write data in the write region.

9. The memory system of claim 8, further comprising:

generating a write error correction code based on the new write data; and storing the write error correction code in the write region.

* * * * *